(12) United States Patent
Clemente et al.

(10) Patent No.: US 10,256,511 B2
(45) Date of Patent: Apr. 9, 2019

(54) SECONDARY BATTERY HOUSING WITH CONTROL ELECTRONICS

(71) Applicant: Bren-Tronics, Inc., Commack, NY (US)

(72) Inventors: Tullio Clemente, Port Washington, NY (US); Alan Squillante, Kings Park, NY (US); Azer Ilkhanov, Brooklyn, NY (US); Jarred Kahn, Babylon, NY (US); David Sandler, Saint James, NY (US); Henry Paczkowski, Manhasset Hills, NY (US); Peter J. Burke, East Northport, NY (US); Sai Fung, Melville, NY (US)

(73) Assignee: Bren-Tronics, Inc., Commack, NY (US)

( * ) Notice: Subject to any disclaimer, the term of this patent is extended or adjusted under 35 U.S.C. 154(b) by 283 days.

(21) Appl. No.: 15/166,122

(22) Filed: May 26, 2016

(65) Prior Publication Data

US 2016/0372801 A1 Dec. 22, 2016

Related U.S. Application Data

(60) Provisional application No. 62/167,499, filed on May 28, 2015.

(51) Int. Cl.
*H02J 7/00* (2006.01)
*H01M 10/42* (2006.01)
(Continued)

(52) U.S. Cl.
CPC ........ *H01M 10/4264* (2013.01); *G01R 31/36* (2013.01); *H01M 2/1077* (2013.01); *H01M 2/206* (2013.01); *H01M 10/4207* (2013.01); *H02J 7/0042* (2013.01); *H01M 2/105* (2013.01); *H01M 10/0525* (2013.01); *H01M 10/486* (2013.01); *H01M 2010/4271* (2013.01); *H01M 2200/103* (2013.01); *H02H 7/18* (2013.01);
(Continued)

(58) Field of Classification Search
USPC ....................................................... 320/112
See application file for complete search history.

(56) References Cited

U.S. PATENT DOCUMENTS 4,959,764 A 9/1990 Bassett
5,157,318 A * 10/1992 Wang .................... H02J 7/0009
320/110
(Continued)

*Primary Examiner* — Samuel Berhanu
(74) *Attorney, Agent, or Firm* — Keusey & Associates, P.C.

(57) ABSTRACT

Rechargeable cells in cylindrical form are arranged within frames in a honeycomb structure and coupled by connecting straps outside the frames to form cell pack. Several cell packs, an electronic switch and control circuit are integrated into the battery housing. A bus bar extends around the perimeter of the housing. A high density MOSFET switch is coupled between the bur bar and the battery contact. A high power electronic clamp disposed across the battery terminals absorbs or redirects transients. An active, high-efficiency, low-noise cell balance converter or a LC based resonant converter may also be provided. For advanced battery applications a +5V CAN bus interface is provided via two circular connectors. Thermistors are provided for use in a thermal protection scheme.

24 Claims, 16 Drawing Sheets

(51) Int. Cl.
    *G01R 31/36*     (2019.01)
    *H01M 2/10*     (2006.01)
    *H01M 2/20*     (2006.01)
    *H02M 3/335*     (2006.01)
    *H02H 7/18*     (2006.01)
    *H01M 10/0525*     (2010.01)
    *H01M 10/48*     (2006.01)

(52) U.S. Cl.
    CPC ........... *H02J 7/0019* (2013.01); *H02J 7/0021* (2013.01); *H02J 7/0091* (2013.01); *H02M 3/33523* (2013.01); *Y02B 40/90* (2013.01); *Y02B 70/1433* (2013.01); *Y02E 60/122* (2013.01); *Y02E 70/40* (2013.01)

(56) References Cited

U.S. PATENT DOCUMENTS

| | | | |
|---|---|---|---|
| 5,325,283 A | 6/1994 | Farrington et al. | |
| 5,729,115 A * | 3/1998 | Wakefield | H02J 7/0006 320/110 |
| 6,069,803 A | 5/2000 | Cross | |
| 6,229,285 B1 * | 5/2001 | Ding | H01M 10/44 320/132 |
| 6,370,050 B1 | 4/2002 | Peng et al. | |
| 7,193,392 B2 | 3/2007 | King et al. | |
| 7,642,744 B2 * | 1/2010 | Zedell, Jr. | H02J 7/0045 320/107 |
| 8,217,622 B2 * | 7/2012 | Stocking | H02J 7/0044 320/107 |
| 8,530,069 B2 | 9/2013 | Wood et al. | |
| 8,749,995 B2 | 6/2014 | Frattini et al. | |
| 9,054,400 B2 | 6/2015 | Shiraishi et al. | |
| 9,142,979 B2 | 9/2015 | Tsai | |
| 9,172,257 B2 | 10/2015 | Touzani et al. | |
| 2005/0233210 A1 * | 10/2005 | Horie | H01M 2/34 429/161 |
| 2009/0206657 A1 | 8/2009 | Vuk | |
| 2011/0121781 A1 * | 5/2011 | Burke | H02J 1/06 320/110 |
| 2014/0203778 A1 * | 7/2014 | Ohnuki | B60L 11/18 320/109 |
| 2015/0349390 A1 * | 12/2015 | Aiba | H01M 2/1077 429/90 |

\* cited by examiner

Normal Discharge Current Flow

Discharge Current Flow Without Diode

Discharge Current Flow Without Diode

SECONDARY BATTERY HOUSING WITH CONTROL ELECTRONICS

CROSS-REFERENCE TO RELATED APPLICATIONS

This application claims the benefit under 35 U.S.C. § 119(e) from U.S. Provisional Patent Application No. 62/167,499 entitled Rechargeable Batteries with Battery Management, High Current Switching and Protection, and Smart Battery Features filed May 28, 2015.

BACKGROUND OF THE INVENTION

1. Field of the Invention

The invention relates to a secondary battery housing and control electronics.

2. The Prior Art

High capacity secondary batteries are formed by packing multiple rechargeable cells into a housing. The packing configuration can occupy a large volume, inadequately protect the cells from impact shock or lead to overheating. In addition, the battery requires sophisticated electronics to balance the charge between high and low voltage cells, protect the system from over-voltage conditions, efficiently convert power for output, provide suitable smart connectors, and provide battery status indicators.

A prior art example of a battery module is disclosed in U.S. Pat. No. 8,530,069 where cylindrical cells are packed into an upper tray and a differently configured lower tray. The cells are retained in sockets with bus bars coupling the cells together at the top end only. Posts 54 raise the lower tray to create a vent chamber. Wires extend out of the housing to external sensors. The prior art patent does not isolate battery packs from each other nor does it provide control electronics within the housing.

Batteries for these specialized applications having multiple cells require cell balance converters. Most cell balance converters are either passive or utilize "hard switching topology." The passive devices dissipate power leading to inefficiency. The converters based on "hard switching topology" produce a large amount of EMI. Furthermore, all commercially available converters suffer from consuming more than 120 mW, design limitations preventing operation at 33V, or no isolation. One prior art cell balance converter is disclosed in U.S. Pat. No. 9,172,257. The converter circuit has a complex secondary winding configuration and does not provide a capacitor in the series loop with the battery and the winding. U.S. Pat. No. 9,142,979 shows an alternate configuration, however the circuit lacks a capacitor on the battery/switch series loop.

When incorporating a battery protection switch, a low power isolated converter is needed which can operate throughout the varying battery terminal voltage range. Certain solutions have been proposed in U.S. Pat. No. 6,370,050 and U.S. Published Patent Application 2009/0206657. However, both references use multiple switches on each battery loop which adds to the cost, power usage and complexity of the control circuit. Other examples in non-battery applications can be found in U.S. Pat. No. 5,325,283 and U.S. Pat. No. 4,959,764 and U.S. Pat. No. 6,069,803 and U.S. Pat. No. 8,749,995. Since these circuits draw from mains power, conserving space and low power consumption are not addressed.

When multiple cells are present it is desirable to provide a corresponding number of bidirectional switches that allow individual control of the charge and discharge paths. In addition the switch paths require balancing resistors and bypass capacitors. Normally, bilateral semiconductor switches are not used at this current level integrated with the bus bar inside a battery. U.S. Pat. No. 7,193,392 provides multiple switch paths but does not have the switch integrated with the bus. U.S. Pat. No. 9,054,400 has the semiconductor switch attached to the bus, but does not disclose bidirectional switches with individual paths.

Presently battery electronic switches are opened slowly so not to produce large transients or they use contactors which are not prone to damage by voltage transients.

Current 6T batteries are non-smart batteries, having limitations with regard to interconnecting of batteries and display of State of Charge, Voltage, Current and other pertinent battery information.

Currently thermal protection is achieved by low cost encapsulated thermistors which are subject to electromagnetic radiation that can affect the validity of the temperature measurements.

SUMMARY OF THE INVENTION

It is one object of the present invention to provide rechargeable batteries containing lithium-ion (Li-Ion) chemistry within a housing containing integrated control electronics.

It is another object to create an active, high-efficiency, low-noise cell balance converter.

A further object of the invention is to provide a LC based resonant converter containing an inductor (L) and a capacitor (C).

It is another object to provide a high-current, bilateral, semiconductor-based internal battery protection switch in the smallest possible space.

It is a further object of the invention to provide a high power electronic clamp across the battery terminals to absorb or redirect the transients.

It is another object of the invention to provide for vehicle batteries a +5V CAN bus interface via two circular connectors. The two connectors are wired in parallel to enable a daisy chain configuration. The State of Charge (SOC) would be displayed in a multi-segment LCD to provide a visual indicator.

It is a further object of the invention to provide thermistors for thermal protection that are sampled by a microprocessor. The samples are then digitally filtered and analyzed for multiple parameters that are collectively used to determine sample validity.

These and other related objects are achieved by an embodiment of the invention featuring an apparatus for electronically controlling and mechanically coupling cells together within a battery housing. Many cylindrical cells are provided having a positive contact on one circular end and a negative contact on the other circular end. The cells are held between two end frames each having a plurality of cell-receiving cups arranged in rows. Adjacent rows are staggered from each other by approximately one-half of the cell diameter so that said cells are retained within the end frames in a honeycomb configuration to form a cell pack. Each cell-receiving cup has an annular ring capped on one end with a circular bottom having an aperture therethrough. Connecting tabs extend across adjacent cups on the exterior of the cell pack. The connecting tabs are electrically soldered to cells through said apertures to sandwich the end frames between said cells and the connecting tabs. An electronic switch and control circuit including an LC resonant converter are disposed within the housing. The LC resonant converter maintains all cells at the same potential voltage and state of charge.

The LC resonant converter includes a steered resonant flyback converter with zero voltage MOSFET switching of sinusoidal waveforms at the self-resonant frequency of the LC resonant circuit. The cells, the MOSFET switch and the inductor (L) are in a series loop. A first diode and the capacitor (C) are in parallel with the MOSFET switch. A transformer has the first inductor (L) as the primary winding on the battery side and a secondary winding on the output side. The secondary winding is in series with a second diode and an output capacitor. The transformer output is in parallel with the capacitor.

Each end frame includes an internal side facing the cells and including the cell-receiving cups, and an opposed external side with shallow channels for receiving the connecting tabs. The connecting tabs extend from one cup to another, coupling the corresponding cells from positive contact to negative contact, wiring the cells in series. The cell packs are then connected in parallel. The internal side of said end frame includes support posts extending off of the annular rings with tapered ends that align the cell within the cell-receiving cup. The support posts are disposed between selected groups of three adjacent cell-receiving cups. Some of said support posts have a triangular cross-sectional shape with the three sides being concave with a curvature matching the cylindrical cells.

Thermal fuses are electrically connected to said cells which blow under excessive currents. Potting compound surrounds the thermal fuses and part of the connection to the cells to insulate the thermal fuses from heat generated from normal cell operation.

The control circuit further includes an isolated steered current resonant converter to provide a high side power supply for the MOSFET switch where energy will be transferred back and forth between a third inductor (L) and a third capacitor (C). The cells, the MOSFET switch and the third inductor (L) are in a series loop. A third diode and a third capacitor (C) are in parallel with said MOSFET switch. A second transformer includes the third inductor (L) as the primary winding and a fourth winding in series with a fourth diode and a fourth output capacitor so that the transformer output is in parallel with the fourth capacitor.

The apparatus further includes isolation mounts and five-sided pockets. Each end frame includes slots along its periphery which have a height approximately equal to the height of the annular rings. Tabs on the isolation mounts are installed in the slots, with extending feet to absorb shock and vibration by distancing the cell pack from the internal surfaces of the five-sided pocket when the cell pack is contained within it to form a pocketed cell pack.

The apparatus further includes a tray cover attached to the battery housing and forming the sixth side of said five-sided pockets. On the top side of the cell pack the isolation mounts distance the cell pack from the bottom surface of the tray cover. A negative bus bar, a positive bus bar, the electronic switch and the control circuit are disposed within the tray.

Each cell pack includes one set of connecting tabs that electrically terminate in a negative cell pack terminal and another set of connecting tabs that electrically terminate in a positive cell pack terminal. The pocketed cell packs are arranged within the battery housing so that the negative cell pack terminals are located in the middle of the battery housing and the positive cell pack terminals are at the edge of the battery housing. The negative bus bar is located in the middle of the tray cover directly above, and in electrical connection with, the negative cell pack terminals. The positive bus bar is a continuous rectangular metal frame disposed around the edge of the tray cover directly above, and in electrical connection with, the said positive cell pack terminals. The continuous rectangular metal frame structurally supports the tray cover around its periphery where it is bonded to the battery housing.

The apparatus also includes a positive battery output terminal. The electronic switch includes a high density bidirectional MOSFET switch having a plurality of bilateral paths in parallel with cell balancing resistors so that all paths transmit the same current. The MOSFET switch electrically couples the cells to the positive bus bar, and the positive bus bar is a heat sink for the MOSFET switch. The apparatus further includes a negative battery output terminal electrically coupled to the negative bus bar. Positive and negative battery posts are keyed for connection to the respective battery output terminals. The positive battery post includes keying which is different from the negative battery post keying so that the posts can only be attached to output terminal of similar polarity.

While various cells may be used, the apparatus according to the invention is particularly suited for use with Lithium-Ion (Li-Ion) cells. A strip heater is intertwined between the cells in the separation formed by said honeycomb configuration to warm the cells if the ambient temperature is below the specified operating temperature of the cells.

The includes an integrated high energy clamp having a third switch and a fifth capacitor arranged in series with the cells. The fifth capacitor functions as an energy reservoir to absorb currents when the third switch is open. The high energy clamp further includes a high current fifth diode in parallel with the fifth capacitor and coupled across the positive and negative terminals of the cell so that current continues to flow while the voltage across the battery is clamped. The high energy clamp operates in one set of modes when a charger is connected to the battery, and a second set of modes when a load is connected to the battery.

The apparatus also includes a smart bus and a multi-pin connector mounted to the exterior of the battery housing, for example on the tray or other external cover. The bus and multi-pin connector and smart bus are coupled to the control circuit. The multi-pin connector includes a low voltage pin to supply low voltage and activate smart bus function, a high voltage pin to supply high voltage and activate the smart bus function; a high communication signal pin, a low communication signal pin and a ground pin. The smart bus provides state of charge, voltage, current and other battery information.

The apparatus further includes a visual display mounted to the exterior of the battery housing, for example the tray or other external cover. The display is coupled to the smart bus or control circuit to indicate the battery state of charge. The control circuit further includes a thermal protection system having a thermistor to sense battery temperature and output temperature data. A microprocessor is coupled to the thermistor for sampling the temperature data, digitally filtering the samples to generate several parameters, and collectively analyzing the parameters to determine the sample validity.

BRIEF DESCRIPTION OF THE DRAWINGS

The advantages, nature, and various additional features of the invention will appear more fully upon consideration of the illustrative embodiments now to be described in detail in connection with accompanying drawings. In the drawings wherein like reference numerals denote similar components throughout the views.

DETAILED DESCRIPTION OF THE PREFERRED EMBODIMENTS

Figure 1A:
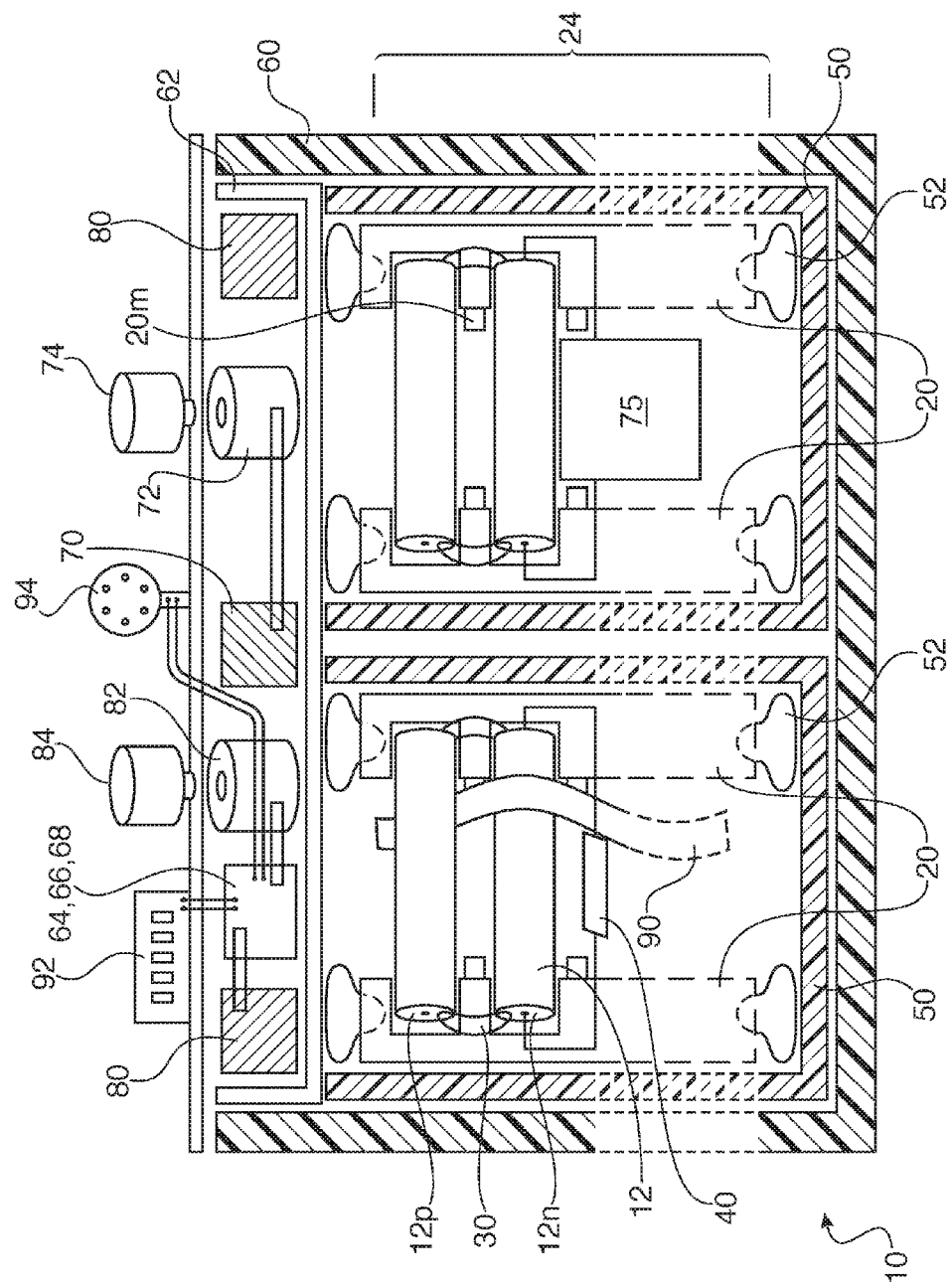
FIG. 1A is an internal view of the battery showing the cells within end frames disposed within pockets inside the housing.

The invention relates to the assembly of cell packs into a housing with integrated control electronics to form a rechargeable battery. The battery, for example, a Lithium-Ion (Li-Ion) Battery, may be useful for vehicle and other high capacity applications.

The arrangement of cells is critical to facilitate the assembly process. The series and parallel arrangements of cells are often inefficient to connect in an economical and functional arrangement. The assembly is shown in FIG. 1A as an apparatus 10 for electronically controlling and mechanically coupling cells together within a battery housing 60.

The 18650 cells are arranged into six cell packs. Two cell packs 24 are shown, in a first row, where two additional rows may by added behind the two cell packs shown. The cell packs are then tied in parallel with substantial bus bars. The construction of the cell packs uses two symmetrical honeycomb shaped parts to hold each end of the cylindrical cells (49 cells for 24 v and 48 cells for 12 v). The cells 12 and honeycombs, illustrated as end frames 30 get press-fitted and held together by friction fit. The end frame has alignment feature that gradually spread & align all cells at the same time as press-fit process takes place. The honeycomb part holds the cells in relation to each other so as to provide a gap between cells of sufficient size to improve safety by slowing heat conduction from a failed cell and adjacent cells. The gap is also sufficient to allow a strip heater 90 to be snaked between cells providing direct heat to each cell.

Figure 1B:
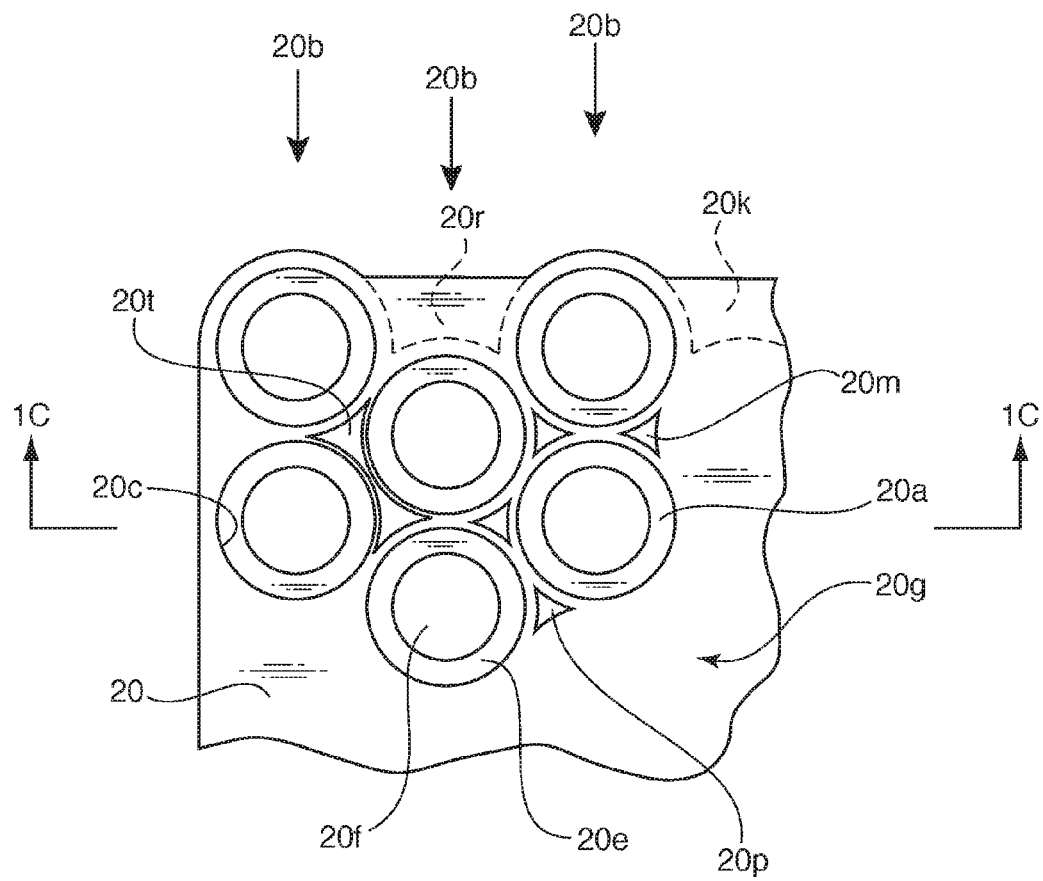
FIG. 1B is an enlarged, top plan view of a section of an end frame.
Figure 1C:
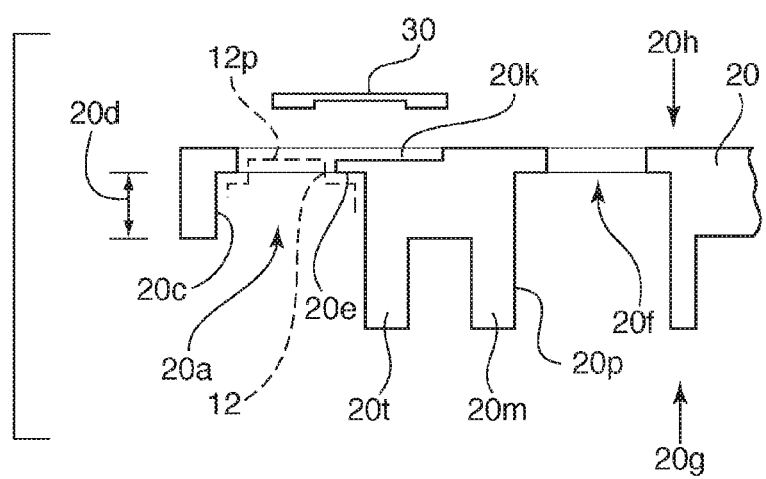
FIG. 1C is a cross-sectional view of the end frame section taken along the line 1C-1C from FIG. 1B.
Figure 2A:
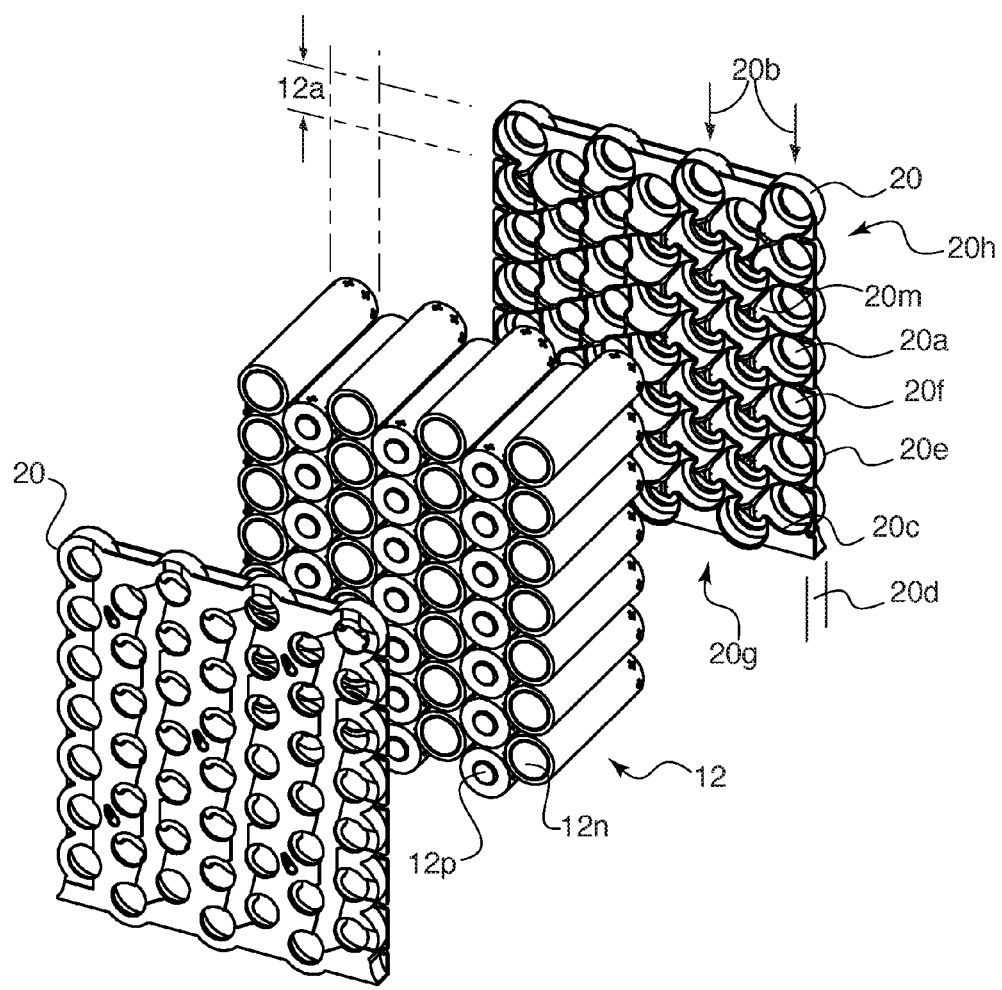
FIGS. 2A, 2B and 2C are exploded views of the cell packs.

Cells 12 are arranged within end frames 20 in rows 20b, as shown in FIGS. 1A, 1B and 1C. In each row the cells are places with alternating positive ends 12p and negative ends 12n facing one direction. Connecting tabs 30 are soldered to adjacent cells, connecting a positive end 12p to a negative end 12n, thereby forming a series connection for the cells within the cell pack 24. FIG. 1B shows an enlarged view of one corner of an internal side 20g of end frame 20. The cells have a diameter 12a, with cups 20a being configured slightly larger. A plurality of cups 20a are arranged in rows 20b, that are offset by one-half the cup diameter to create a honeycomb configuration of cells. Each cup 20a includes an annular ring 20c that is a vertical wall in the view of FIG. 1B. The annular ring height 20d is shown in FIGS. 1C and 2A. The lower part of annular ring 20c terminates in a bottom 20e having an aperture 20f formed therein. In between adjacent groups of three cups, there are posts 20m, which extend up, off the page, with tapered top ends to guide the cells into the cups during the press fitting operation. The posts do not have regular triangular cross-sections, rather the posts have three concave sides 20p that conform to the arc of the cups (and slightly larger that the circumference of the cells). At selected locations, the posts are formed between four adjacent cups as double triangles. These double triangular cross section posts 20t may by located in the corners, or in rows through the middle of an end frame to provide additional strength and stiffness to the end frame. FIG. 1B also shows slots 20r at the periphery of end frame 20, in the region where a row 20b is staggered downward.

Tabs 30 connect the cells. The tabs are designed with an offset to provide compliance to reduce stress on the weld joints that provide cell to cell connections. The tabs are shaped to self fixture and align themselves to the cells for improved assembly. The tabs that interconnect cells are configured to provide a series connection between cells while providing parallel connection between groups of cells. After welding, these tabs provide additional mechanical grid-locking support between the honeycomb and cells, further preventing these cells from coming loose from friction fit.

The cell packs are protected by thermal fuses 40. The thermal time constant of the fuses has been increased by the addition of a potting compound 40a around the fuses and onto the cells. This eliminates fuse operation due to thermal rise of the cells that is expected during normal periods of high amperage operation. The fuse will still operate to protect the battery during unexpected high current operation.

Figure 2B:
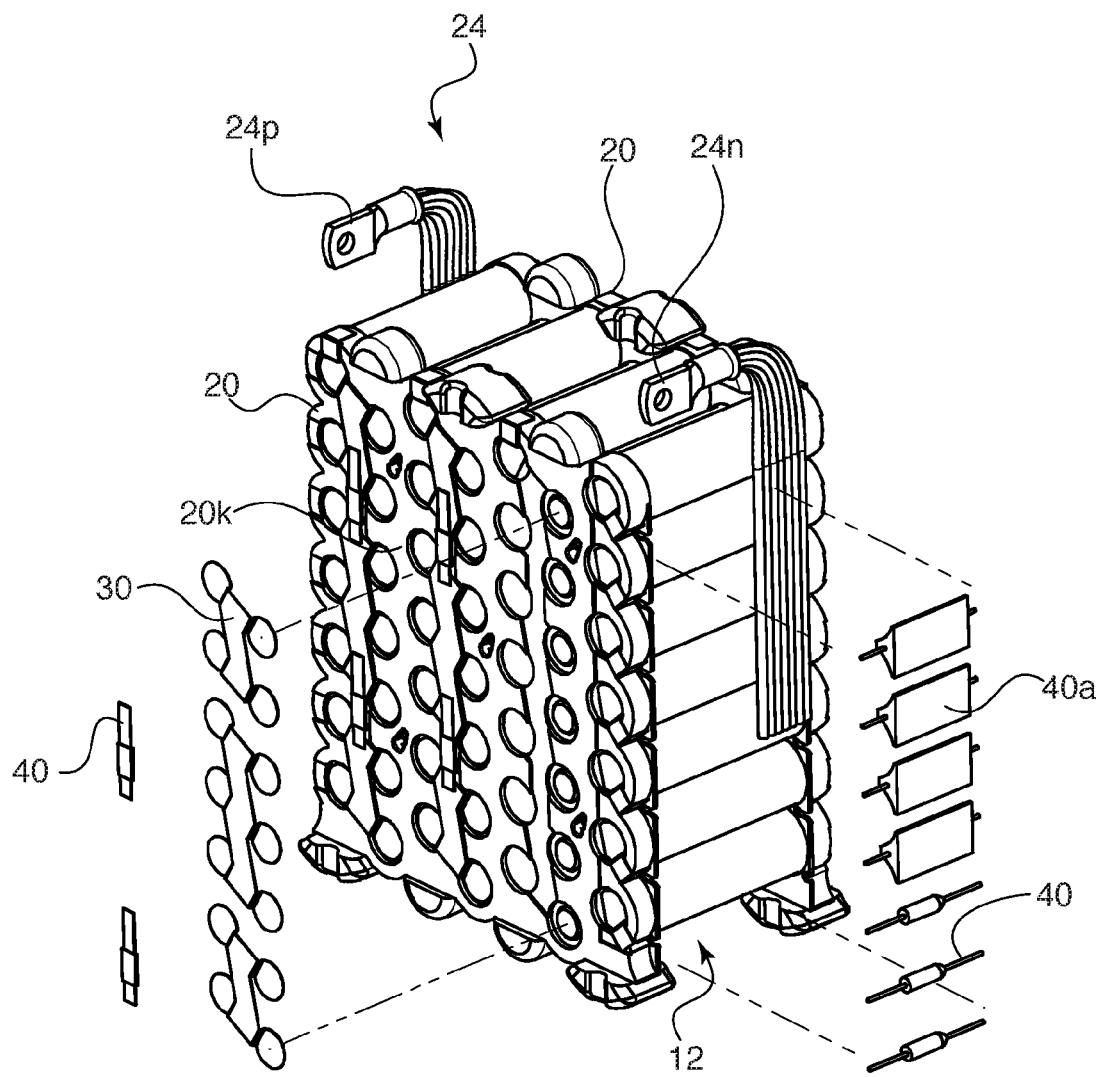

FIG. 2A shows a row of cells with the negative cell contact 12n facing up in one row, and the positive cell contact 12p facing up in the adjacent row. The cells are captured between two end frames 20. In FIGS. 1C and 2B show connecting tabs 30 extending from one aperture 20f to the next to connect cells. Connecting tab 30 sits within a shallow channel 20k formed in the external side 20h of each end frame 20.

As can be seen in FIGS. 2B, 2C, 3 and 4 a central negative bus bar 70 is connected to the negative terminal 24n of the cell packs and the output terminal 72 through a monitoring device. Being centrally located allows the length of this bus to be short to minimize the resistance and voltage drop. A ring bus 80 connects the positive terminal 24p of the cell packs to the output terminal through a switch 64. The cell pack arrangement that provides for a short negative bus necessitates a long current path in the positive bus. To balance resistance from the cell packs to the switch the bus is arranged in a ring to provide self balancing multiple current paths to the switch.

Figure 2C:
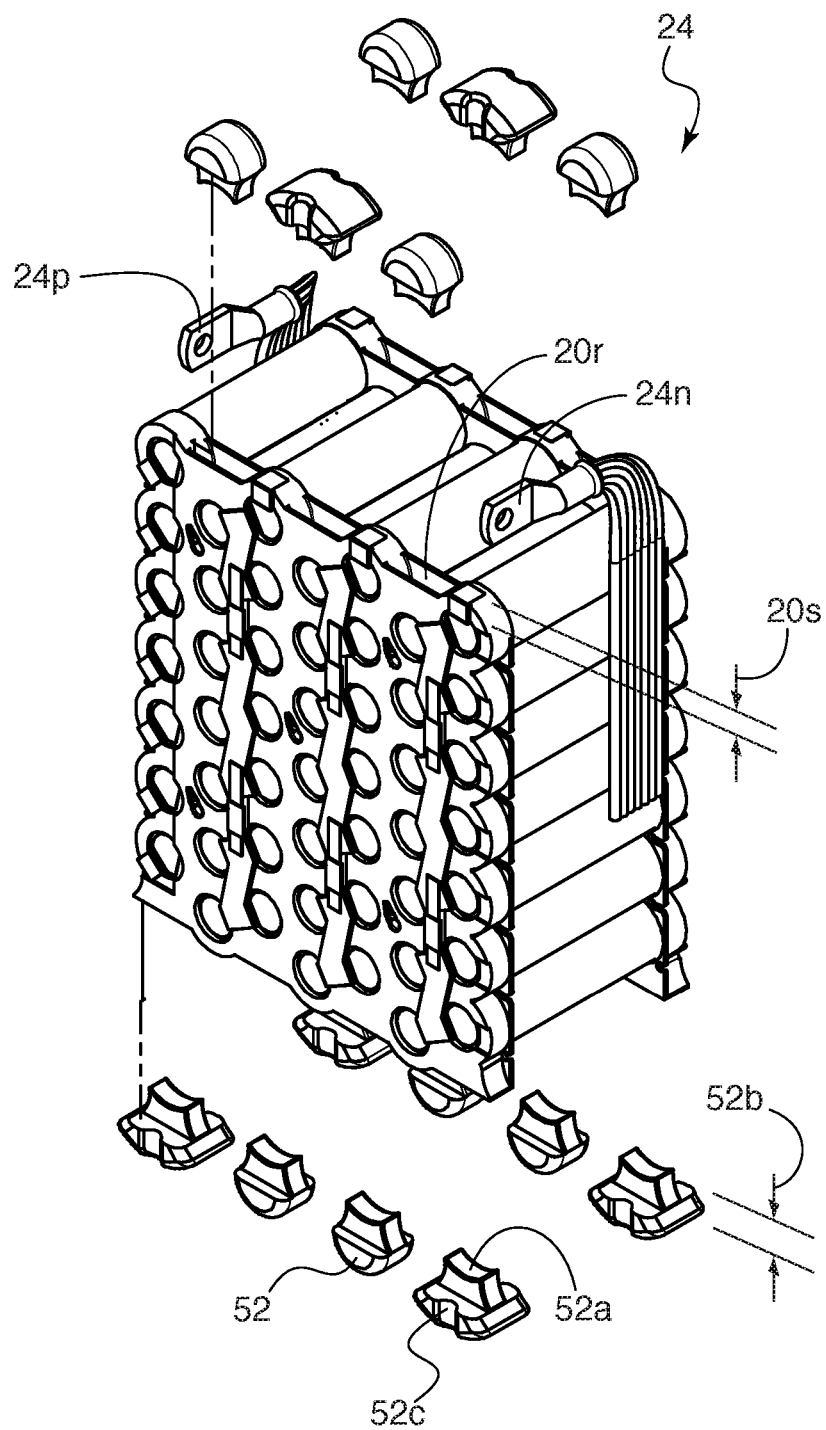
Figure 3:
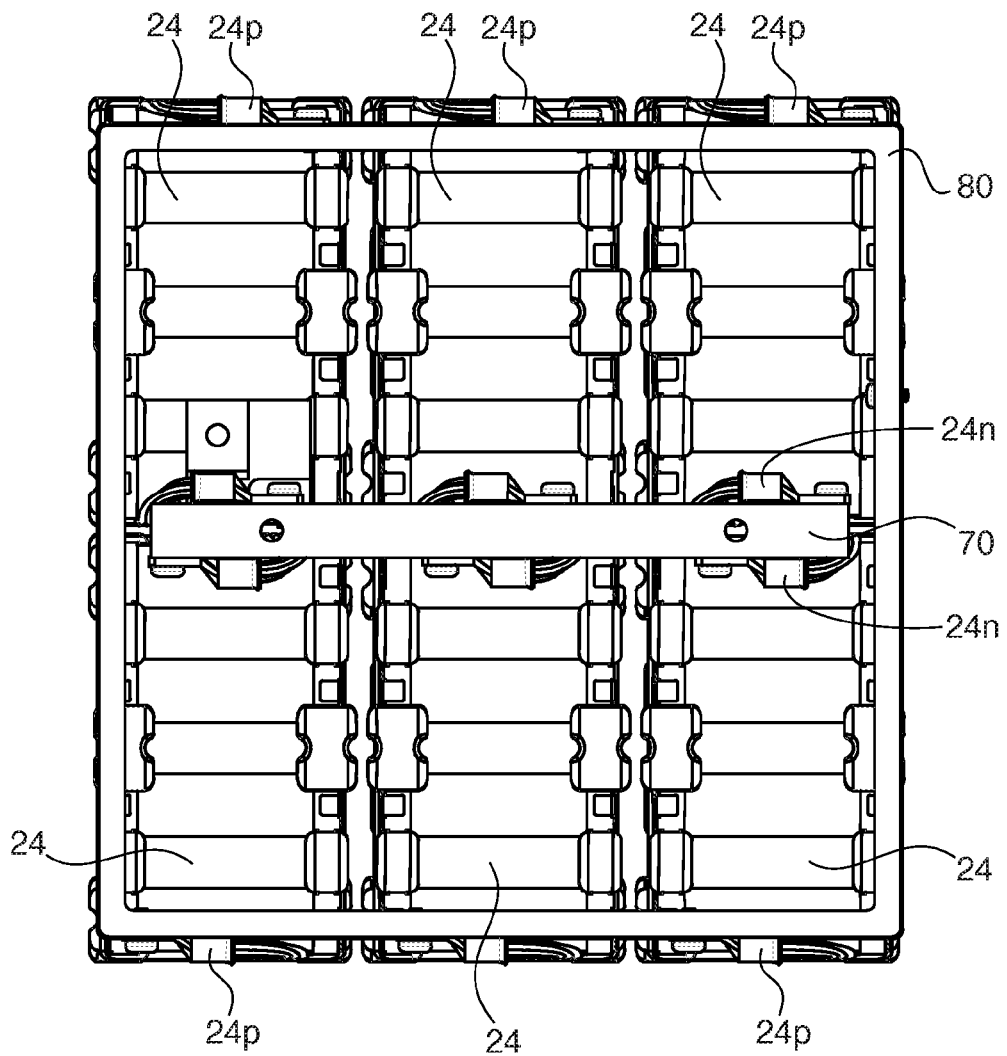
FIG. 3 is a top plan view of the bus bars and cell packs.
Figure 4:
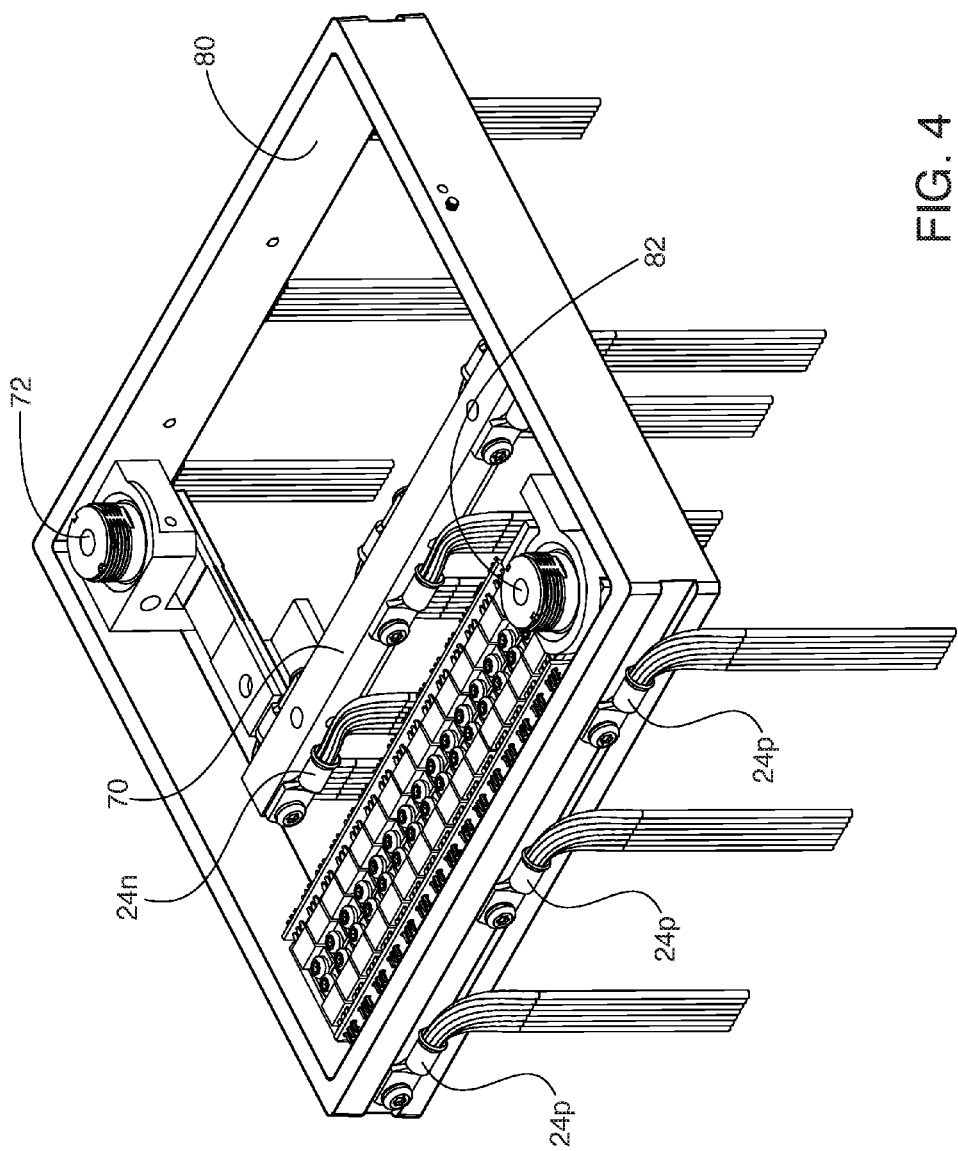
FIG. 4 is a perspective view of the bus bars without the cell packs.

The bus bars, control electronics, and other circuitry are contained in and supported by a plastic tray 62 (FIG. 1A). The tray provides mechanical support and physical separation between components. The positive bus bar ring 80 is designed as a continuous rigid rib structure that fits into the tray perimeter and gives it additional structural support. This allows the tray to take random loads of all 6 packs acting on its otherwise very large surface area during vibration and drop with minimal deflection. The ring then passes this load to the very edge of the cover which is its stiffest section, as the perimeter of the cover 62 is shear bonded to the case, or battery housing 60. The cell packs are allowed to move on isolation mounts 52 to absorb shock and vibration to prevent damage to the cell packs. The cell packs are contained in separate five sided pockets 50 in the battery housing with the isolation mounts touching each side. FIG. 1B shows slots 20*r* located in the edges of end frames 20. FIG. 2C shows the isolation mounts 52 with tabs 52*a* having a height 52*b* slightly smaller than the height 20*s* of the slot 20*r*. Once installed, the foot of the lower isolation mount 52 extends out and laterally to contact the internal bottom and sides of the five-sided pocket 50 (FIG. 1A). The foot 52*c* of the upper isolation mount 52 extends out to contact the bottom of tray cover 62, and laterally to contact the internal side of five-sided pocket 50. The tray provides the top surface of the pockets to restrain the upper side of the cell pack shock and vibration isolators.

The output terminals 72, 82 are flat pads with internal threads. They can be converted to standard posts 74, 84. Anti rotation keying is provided in the posts which are held onto the flat pads through a screw though the center of the posts. The positive and negative posts are keyed differently to prevent installation of the wrong post onto the flat pads.

In certain secondary (rechargeable) battery applications for military and commercial use, there is a need for CAN standard pin connector. For example, when the battery is configured as a rechargeable Li-Ion 24 V 6T battery. The connector allows for interconnecting batteries and the ability to read State of Charge, Voltage, Current and other pertinent battery information. Currently 6Ts are not smart batteries and these features are not available. Mounted on the battery housing a +5V CAN bus interface available on one or two circular connectors 94. When providing two connectors they can be wired in parallel to enable a daisy chain configuration. The connectors will be wired to the control circuit 68. Each connector has six or more contacts with pin designations according to CAN standards. The pin designations are as follows: pin A serves as a +5V supply and is used to activate the CAN functions with a +5V source, that is, apply +5V to pin A at 20 ma to operate the CAN bus; pin C serves as a +28V supply and is used to activate the CAN functions with a 6-36V at 20 ma to operate the CAN bus; pin D is the CANH which transmits high CAN communications signals; pin E is CANL which transmits low CAN communications signals. The connector provides a standard of communication for each battery and provides one or more readings of State of Charge, Voltage, Current and other battery information.

Currently many batteries for these military and commercial applications, for example the 6Ts, are not smart batteries. Therefore, there is no built-in or readily observable means to determine the battery's State of Charge. A display and corresponding circuitry is provided to readily, and with a built-in functionality, indicate visually the State of Charge (SOC). Mounted to the housing 60 is a display 92 connected to control circuit 66. One embodiment of the display includes a five segment LCD to display the SOC. The SOC LCD indicator would be displayed through a window on the battery cover. Each segment would show State of Charge in 20% increments. Displays with other segments could show different increments.

Figure 6:
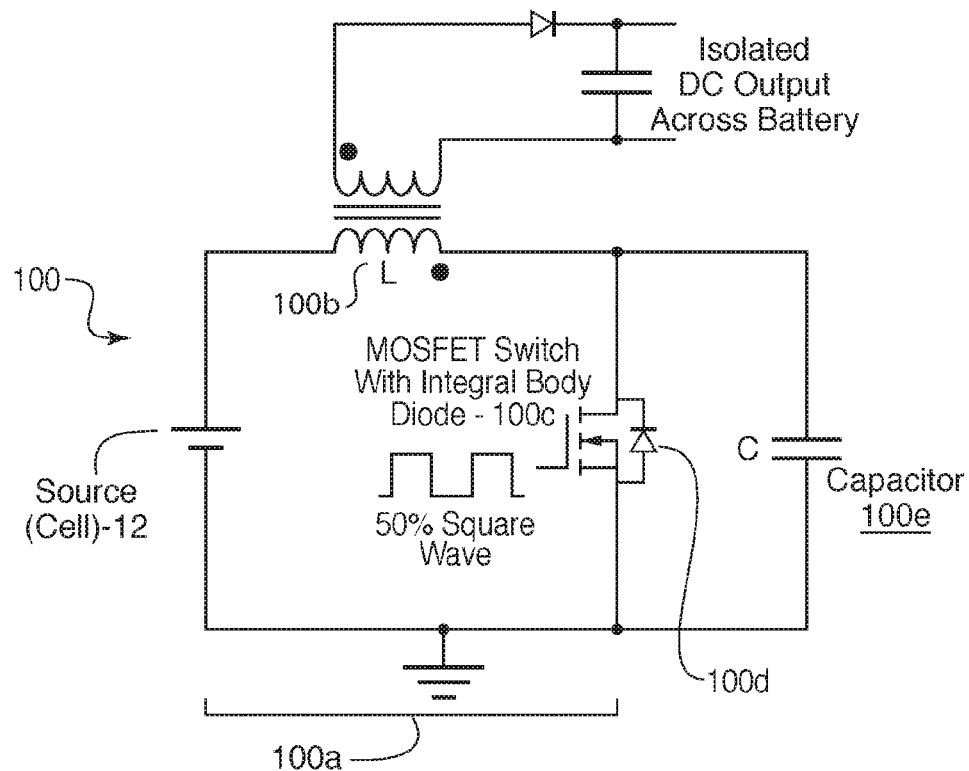
FIG. 6 is a circuit diagram of the cell balance converter.

One aspect of the electronic battery control circuit 66 is an active high-efficiency, low-noise cell balance converter shown in FIG. 6. Most cell balance converters are either passive, which dissipates power, or are based on a "hard switching topology" which produces a large amount of EMI. The battery incorporates a unique Steered Resonant Flyback Converter to perform cell balancing. Cell balancing is used to ensure that all cells in a series string are at the same potential and therefore at the same state of charge. This converter uses zero voltage switching of sinusoidal like waveforms to reduce EMI and increase conversion efficiency. It also uses a resonate capacitor across the switching element which eliminates the need for an energy consuming snubber. The converter is based on an LC resonant circuit and is capable of operating directly from a low voltage cell. The converter is driven with a simple 50% duty cycle drive source which is tuned to the self-resonant frequency of the LC circuit. The converter stores energy in the primary inductance of the transformer when the MOSFET is on and them releases the energy through the secondary when the MOSFET switch is off.

The basic circuit configuration of the cell balance converter 100 includes a series loop 100*a* with the cell 12, inductor (L) 100*b* and MOSFET switch 100*c*. A diode 100*d* and capacitor (C) 100*e* are placed in parallel with the MOSFET switch. The converter is placed across each of the cells 12 in a series string of cells. Whenever the voltage across one cell exceeds the voltage of the other cells, the converter is turned on, discharging that particular cell. The energy that is taken out of the cell is then transferred to the whole battery and not dissipated as heat. In steady state operation the converter essentially operates as an isolated current source. The average current that is taken from one cell is transferred through the turns ratio to the secondary side and applied across the total battery. The converter operates at a high efficiency and in theory if 2 amps is removed from a 4.0V cell, then 286 mA will be put back into the 28.0V battery (2A*4V=8W, 8W/28V=286 mA). Eventually, the cell with the higher voltage will be discharged through this process and its state of charge will be reduced. The process can be repeated on all cells until they are all at the same voltage and therefore at the same state of charge.

The circuit is initialized by turning on the MOSFET. This first positive pulse will allow current to flow from the source through the primary inductance, through the MOSFET and to ground. The current will ramp from zero to a peak value until the MOSFET is turned off. At this point in time, the inductor has stored a certain amount of energy and the current that was flowing in the primary inductance will try to continue flowing in the same direction. Since the MOSFET is now off the current will flow into the capacitor and charge it. The circuit is now basically and LC resonant tank so the current will take on a sinusoidal shape and the energy that was stored in the inductor will start to transfer to the capacitor at the self-resonant frequency of the LC network. The voltage across the capacitor will slowly rise to a peak value and continue to rise until it is clamped. The slow rise time reduces EMI and eliminates turn off switching losses in the MOSFET.

Clamping takes place on the secondary side of the transformer. As the primary waveform raises so does the secondary until it is clamped by the full battery voltage. At this point in time current will start flowing in the secondary winding but at a reduced value fixed by the transformer turns ratio. In this case the ratio is 1:2.9. If one amp was flowing in the primary then only 348 mA would flow in the secondary. The current that is now flowing in the secondary winding will decay at a linear rate determined by the clamp voltage and the secondary inductance. When the secondary current decays to zero, the capacitor on the primary side will still be charged to the clamp voltage and it will start to decay in a resonate sinusoidal mode. As the voltage across the capacitor goes below zero the body diode in the MOSFET switch will conduct the current away from the capacitor. At this point in time the voltage across the inductor is constant so the current through it will be a linear ramp. The current will increase in a linear fashion from a negative value to a positive peak. When the current crosses zero, the MOSFET switch will be turned on again and the cycle will repeat. Again the MOSFET switching losses are eliminated because the MOSFET is turned on at zero voltage.

Figure 7A:
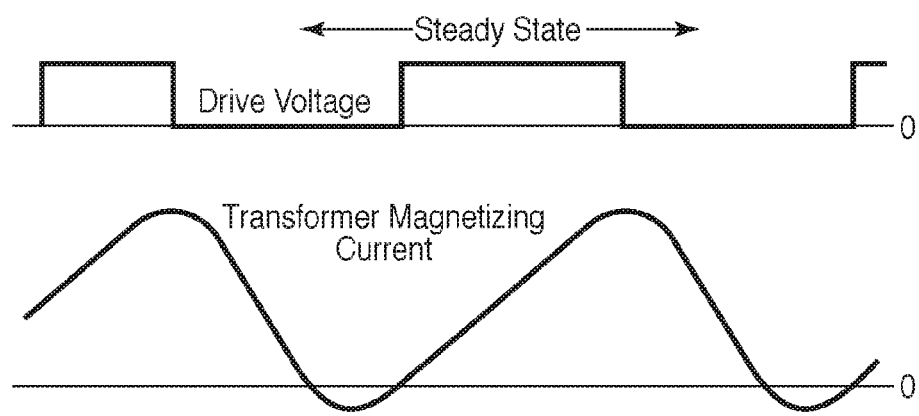
FIGS. 7A and 7B are graphs showing various levels within the cell balance converter.
Figure 7B:
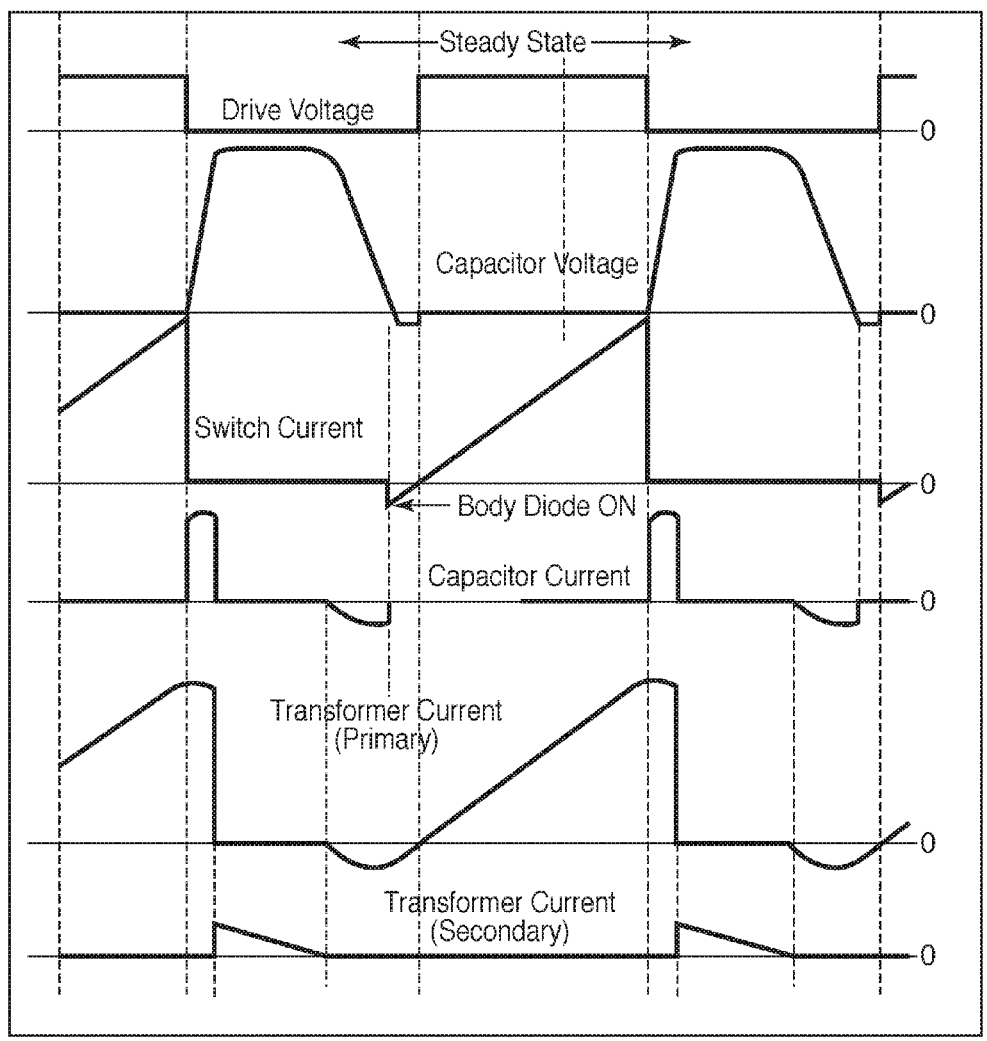

FIG. 7A shows the transformer magnetizing currents as reflected to the primary. Notice that it is continuous and sinusoidal like. This greatly reduces EMI because the waveform has very low high frequency harmonics. FIG. 7B shows the voltage and current waveform in the each of the circuit elements, namely: the drive voltage in steady state; the capacitor (L) voltage; the switch current; the capacitor current; the transformer current on the primary winding; and the transformer current on the secondary winding.

In summary, the high-efficiency, low-noise cell balance converter includes a primary inductor side and a MOSFET switch with an integrated body diode arranged in a first series circuit with source battery cells. The first capacitor disposed in parallel with said MOSFET switch. The diode and a second capacitor arranged in a second series circuit with the secondary inductor side to form a steered resonant flyback converter.

The high-efficiency, low-noise cell balance converter, when in a cell discharge mode directs unacceptably high voltage from any one cell to flow through the primary inductor side then through the MOSFET to ground until a peak current is reached causing the MOSFET to shut off. Further current then flowing to the first capacitor forms an LC resonant tank. The voltage across the first capacitor slowly rises until clamped thereby reducing EMI and eliminating turn off switch losses in the MOSFET.

Another aspect of the invention consists of the control circuit is a Low Power Isolated Steered Current Resonant Converter. Efficient power conversion requires an extremely low power isolated converter to produce a bias voltage for the high side power MOSFET based battery protection switch. The converter must not consume more than 120 mW. The converter must also operation throughout the battery terminal voltage range of 12V to 33V. All other commercially available solutions either consumes greater than 120 mW or will not operate at 33V or are not isolated. The solution is to use a unique LC based resonate converter.

Figure 8A:
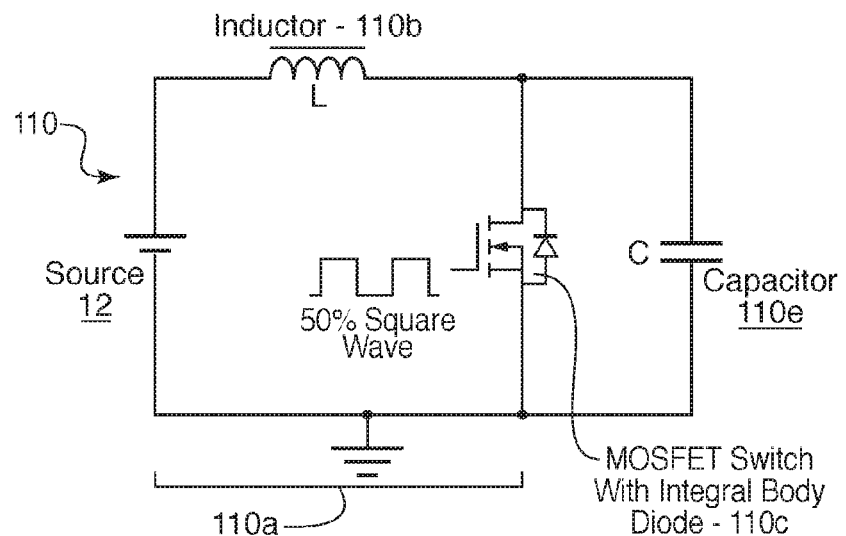
FIGS. 8A and 8B are circuit diagrams of a low power isolated steered current converter and converter configured to create an isolated DC output, respectively.

The battery contains a unique Low Power Isolated Steered Current Resonant Converter to create a floating high side power supply for the high side power MOSFET based bilateral switch. The converter is based on an LC resonant circuit which in theory would consume no power when oscillating and not being loaded down. In reality the converter switches at zero voltage and does have minor conduction and hysteresis losses. The converter is capable of operating directly from a 28V DC battery and is driven with a simple 50% duty cycle drive source which is operated at ½ the self-resonant frequency of the LC circuit. Similar to all resonant LC circuits, energy will be transferred back and forth between the resonant capacitor and the resonant inductor. The basic circuit configuration is shown in FIG. 8A.

The circuit is initialized by turning on the MOSFET. This first positive pulse will allow current to flow from the source through the inductor, through the MOSFET and to ground. The current will ramp from zero to a peak value until the MOSFET is turned off. At this point in time, the inductor has stored a certain amount of energy and the current that was flowing in the inductor will try to continue flowing in the same direction. Since the MOSFET is now off the current will flow into the capacitor and charge it. The circuit is now basically an LC resonant tank so the current will take on a sinusoidal shape and the energy that was stored in the inductor will transfer to the capacitor at the self-resonant frequency of the LC network. The voltage across the capacitor will rise to a peak value and then decay to zero. The voltage will look like a halve sine pulse. The current through the capacitor will be 180 degree out of phase and start out at the same peak value that was flowing in the inductor and then decay though zero and rise to the same magnitude but a negative polarity.

Figure 9C:
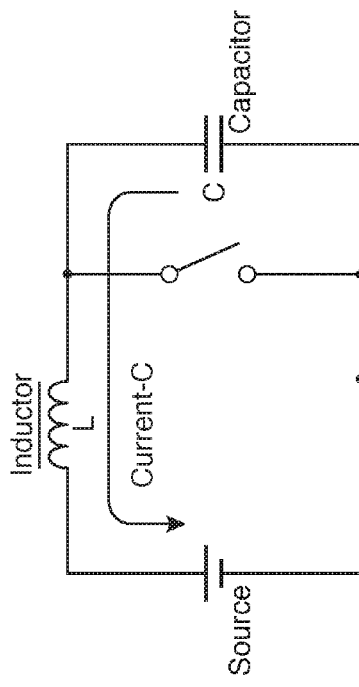
FIGS. 9A-9D are circuit diagrams showing current flow through the low power isolated steered current converter in various stages of operation.
Figure 9D:
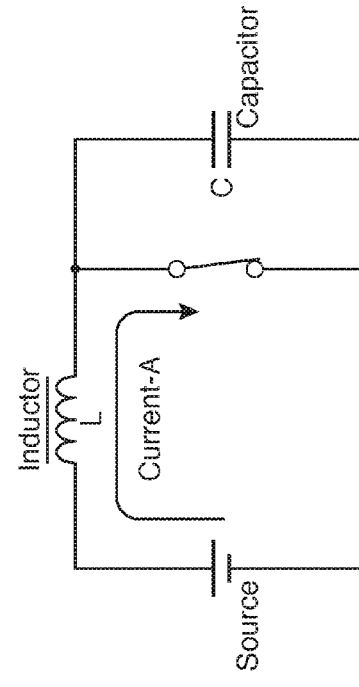
Figure 9A:
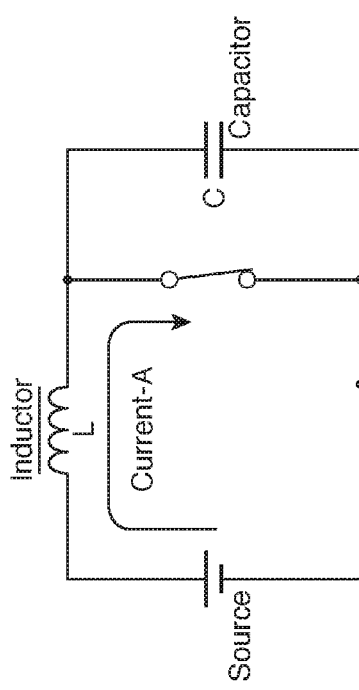
Figure 9B:
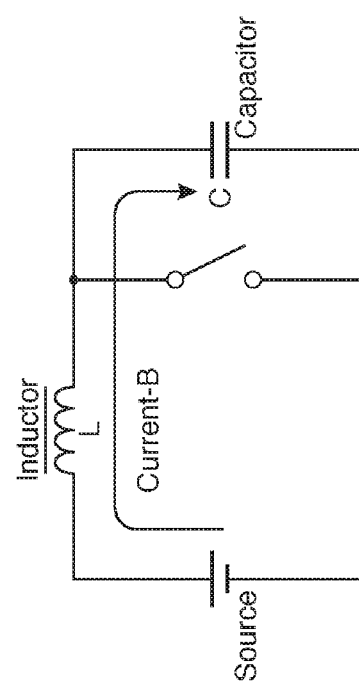

When the voltage in the capacitor decays to zero, the MOSFET switch is turned on again steering the capacitor current through the MOSFET. At this point in time the voltage across the MOSFET is virtually zero so there will be constant voltage applied across the inductor. The inductor current will now ramps up in a linear fashion going through zero and again rising to a peak value. At the peak, the MOSFET is turned off and the current is steered through the capacitor charge it again and repeating the cycle. In steady state the MOSFET will be turned on in sync to the self-resonant frequency of the LC network. When the MOSFET is off the current is allowed to resonate for a halve cycle between the inductor and capacitor. When the MOSFET is on, it will allow a linear current to flow in the inductor from its negative value to another positive peak. FIGS. 9A, 9B, 9C and 9D shows the current flow through the basic circuit. In FIG. 9A linear current flows from source through inductor, through MOSFET switch to ground. In FIG. 9B resonant current flows from source through inductor, through capacitor to ground. In FIG. 9C resonant current flows from capacitor back through inductor and to the source. In FIG. 9D linear current flows from source through inductor, through MOSFET switch to ground.

Figure 8B:
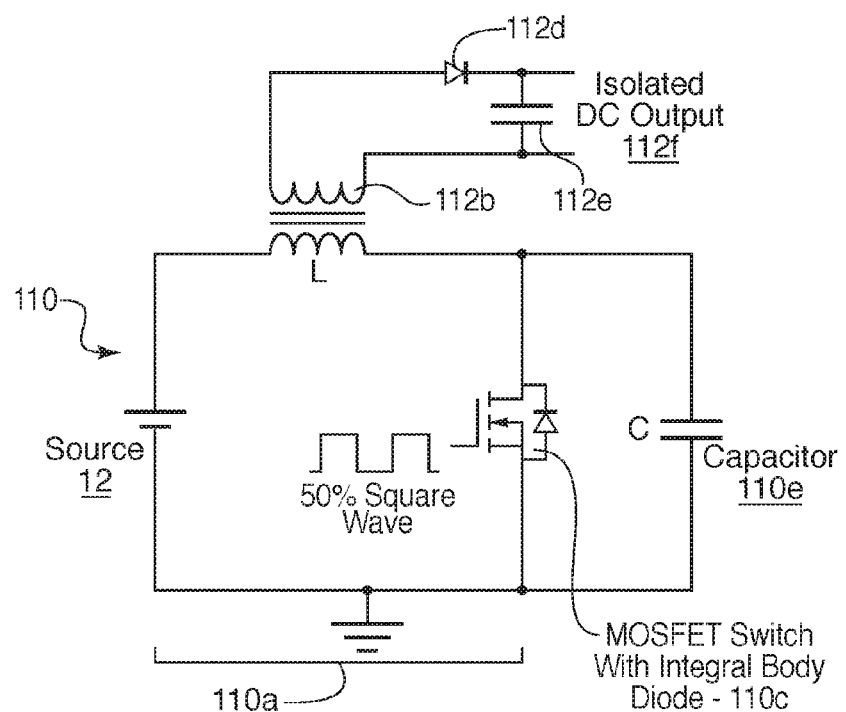
Figure 10:
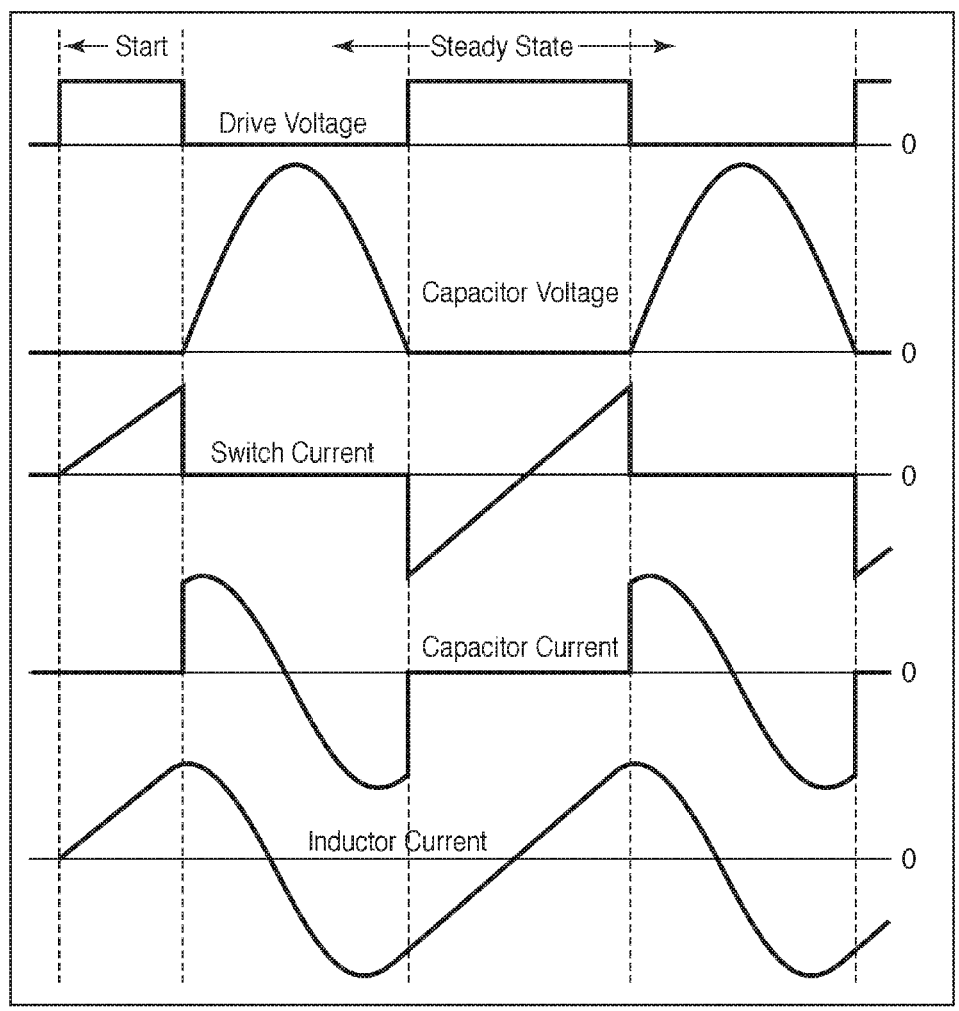
FIG. 10 is a graph showing various levels within the low power isolated steered current converter.

In summary, the high-efficiency, low power isolated power converter 110 includes a primary inductor (L) 110b and a MOSFET switch 110c with arranged in a first series circuit or loop 110a with source battery cells 12. A first integrated body diode 110d and a first capacitor (C) 110e are disposed in parallel with MOSFET switch 110c. The converter, when in a resonate mode, has the MOSFET off and current is allowed to resonate for a half cycle between the primary inductor side and the first capacitor. When the MOSFET is on, a linear current flows in the inductor from its negative value to another positive peak. To form a low power isolated power converter the inductor is replaced by a transformer as shown in FIG. 8B. A second diode 112d and a second capacitor 112e are arranged in a second series circuit with the secondary inductor (L) 112b to provide an isolated DC output 112f. FIG. 10 shows the waveforms for each of the current paths, namely: the drive voltage at steady state; the capacitor voltage; the switch current; the capacitor current; and the inductor current.

Notice that the inductor current is a continuous sinusoidal-like waveform and that its current gets steered between the MOSFET switch and the capacitor. In theory an Ideal MOSFET switch would not introduce any loss and the circuit would resonate continuously without loss or any additional power requirements from the source. In practice the circuit does have minimal losses, and a small amount of energy will be taken from the power source each time the MOSFET is turned on.

In order to make this a low power isolated power converter as shown in FIG. 8B, the inductor is replaced with a transformer. The secondary side of the transformer will be rectified and filtered to produce a DC output.

A further aspect of the control circuit involves a BILATERAL MOSFET SWITCH, and more particularly, a High Density Bidirectional MOSFET Based Switch.

To create a high current bilateral semiconductor based internal battery protection switch in the smallest possible space. Normally, bilateral semiconductor switches are not used at this current level inside a battery The battery contains a High Density Bidirectional MOSFET Based Switch. The use of a MOSFET based switch allows individual control of the charge and discharge path and it also accomplishes this with very low power consumption. The switch contains a total of 30 bilateral paths in parallel with integrated Source balancing resistors to ensure that all paths are handling the same amount of current. The Switch also contains integrated bypass capacitance and transient voltage suppression to help protect the FETs during voltage transient events.

Figure 5:
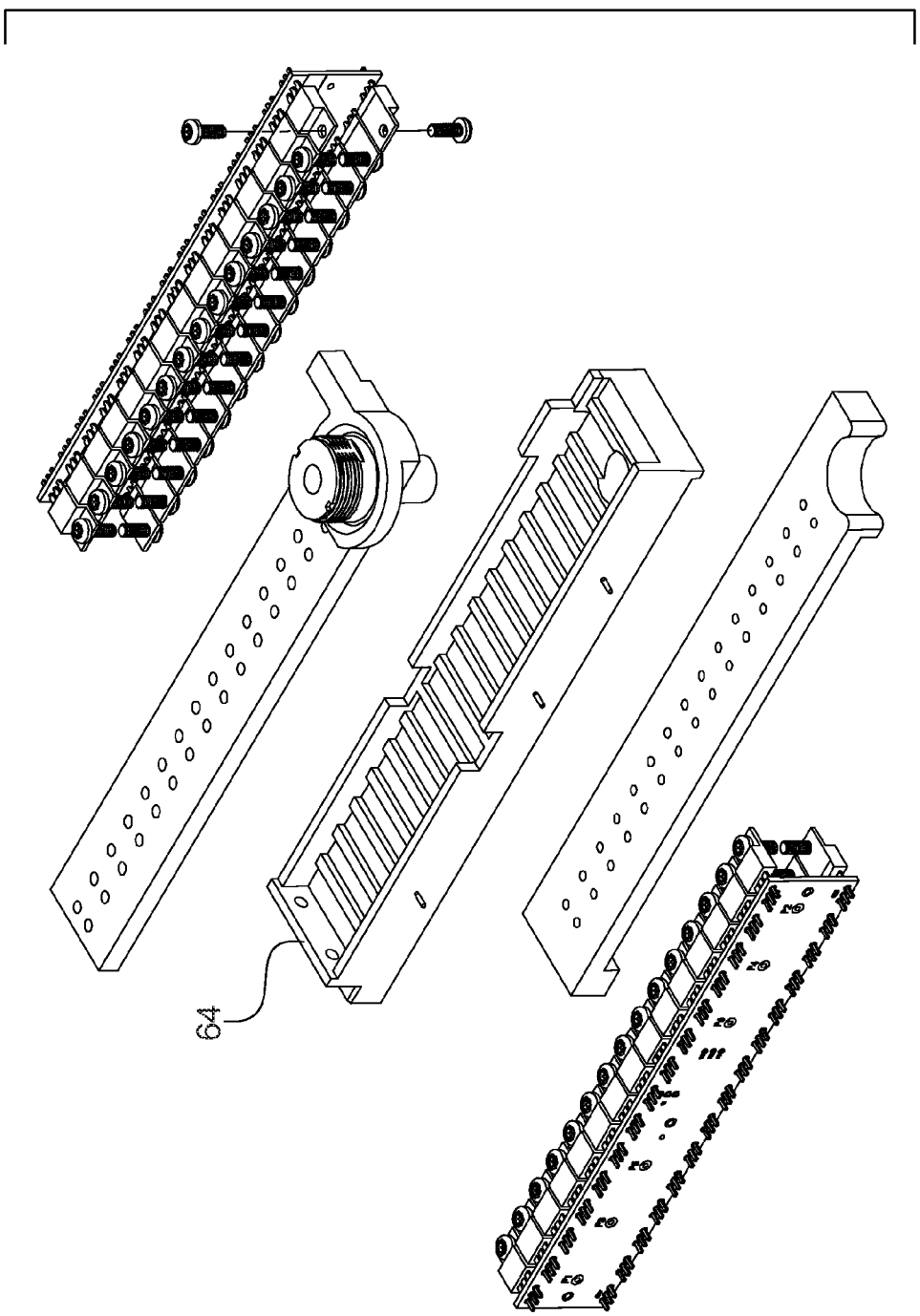
FIG. 5 is an exploded view of the MOSFET switch.

Mechanically the structure is designed with an integrated bus bar which is also used as a heat sink. The assembly was designed as small as possible and to keep the length of the high current paths as short as possible. In summary, the bilateral semiconductor switch to provide internal battery protection includes multiple MOSFETs having a plurality of paths in parallel, thereby providing a high density bidirectional MOSFET switch located within the tray in the exploded assembly shown in FIG. 5. The switch 64 includes integrated source balancing resistors to equalize the amount of current through all paths. The switch further includes integrated bypass capacitance and transient voltage suppression to protect the MOSFETs during voltage transients. The switch also includes an integrated bus bar, for example the positive bus bar 80, that also functions as a heat sink.

Another aspect of the control circuit 66 relates to an Integrated Battery Terminal Energy Clamp to protect the integrated electronic switch from voltage and current transients resulting from the internal switch opening during a fault condition while carrying very high currents in excess of 200 A. Presently battery electronic switches are opened slowly so not to produce large transients or they use contactors which are not prone to damage by voltage transients. The high power electronic clamp is placed across the Battery terminals to absorb or redirect the transients.

The battery includes in control circuit 66 an integrated high energy clamp 68 (FIGS. 11A-F) to prevent stored energy in system wiring from causing excessive voltage to be developed across the battery terminals. External wiring connected to the battery can be expected to carry currents as high as 1100 amps during a cranking event or 7000 A or more during a short circuit event. If and when the internal battery switch opens, the energy that was stored within the inductance of the wiring can create large voltage spikes that could damage the battery or system components.

The clamp 68 contains an internal high current diode 68b and large capacitor 68c to help mitigate any large voltage spikes do to the release of energy from the wires. The capacitor is located inside the battery across the positive and negative terminals. This capacitor will act as an energy reservoir for all currents that would otherwise try to flow into the positive terminal when the internal switch opens. As an example, if the system wiring has an inductance value of 1 uh and is carrying 200 A of charge current, the energy stored in the wire is equal to ½ $L*I^2$, which equates to 20 mj. If the internal battery switch 68a opens (for a number of reasons including a fault) the 200 A charge current will try to continue flowing into the battery, but because the switch is open, the current will instead cause the voltage to rise to very high levels much greater than 100 Volts. The capacitor will absorb the current and convert the stored energy in the wires into a low voltage level across the terminals. In this example the voltage in the capacitor would rise from 28.0V to only 28.3V. Without the capacitor the voltage could rise to hundreds of volts and damage the battery electronics.

Figure 11A:
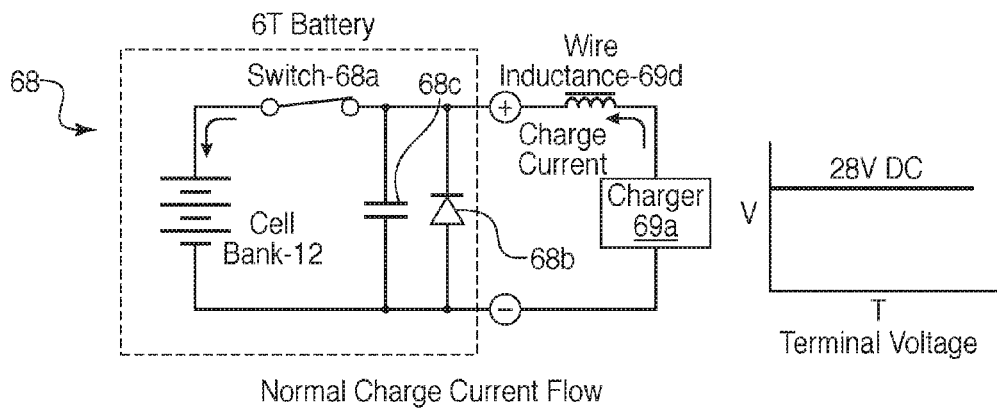
FIGS. 11A-C are circuit diagrams of an integrated battery terminal energy clamp showing current flow in various stages of operation when connected to a charger.
Figure 11B:
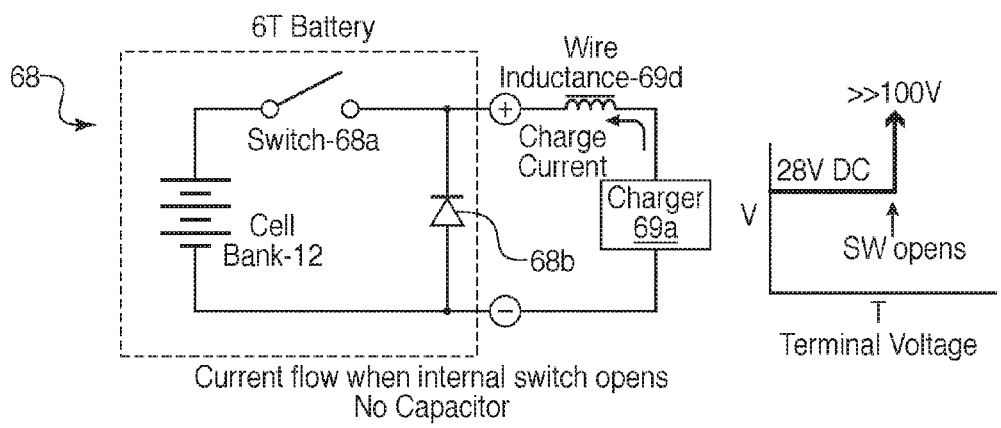
Figure 11C:
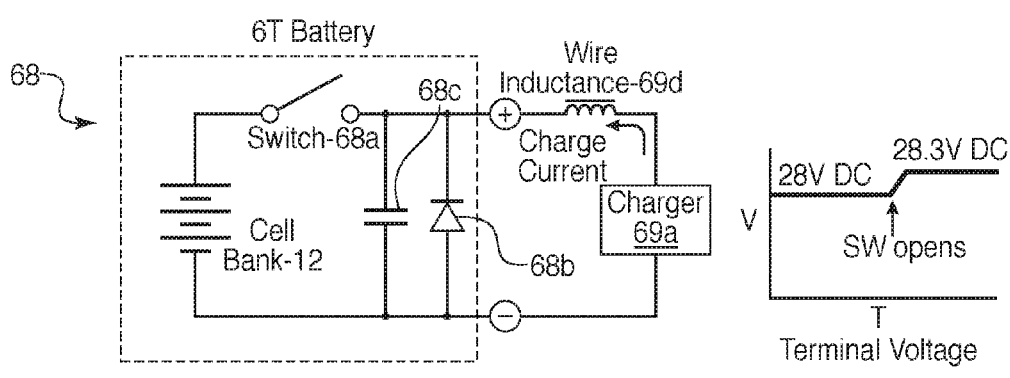
Figure 11D:
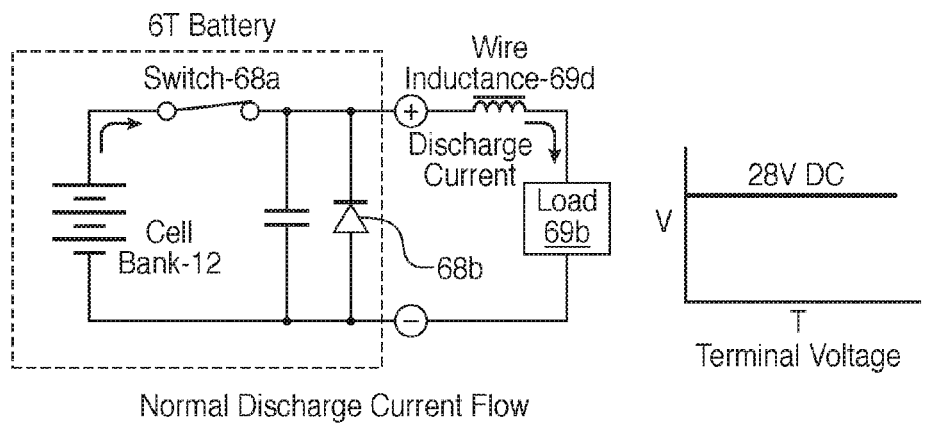
FIGS. 11D-F are circuit diagrams of an integrated battery terminal energy clamp showing current flow in various stages of operation when connected to a load.
Figure 11E:
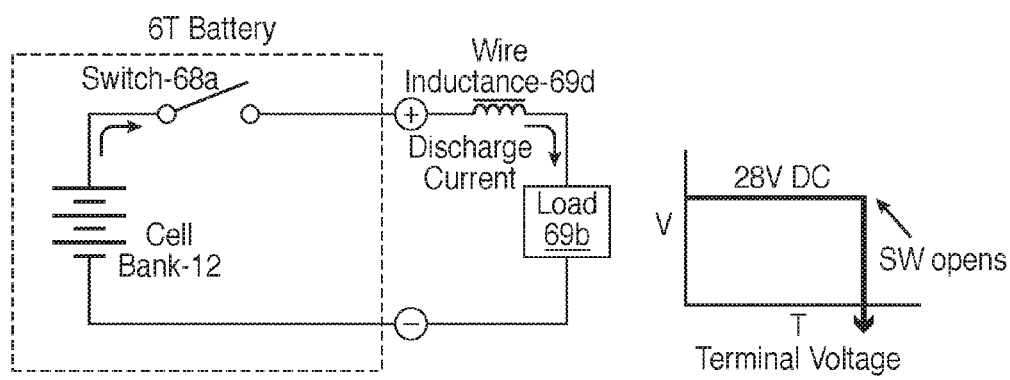
Figure 11F:
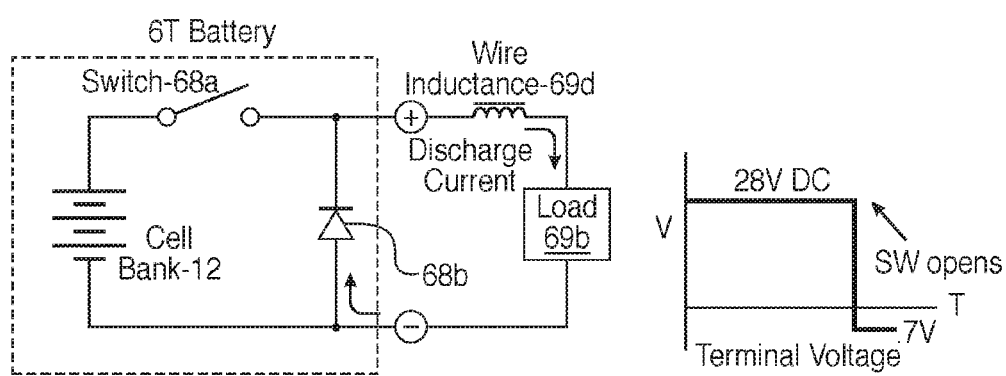

A high current diode is also located across the output terminals with the cathode connected to the positive terminal and the anode connected to the negative terminal. In a case when the system wiring is carrying 200 A of discharge current and the internal switch opens, the current will try to continue flowing through the battery and as a result will cause a negative voltage to appear across the output terminals. This negative voltage, if high enough, will damage the internal battery electronics. The added diode will allow the current to continue flowing while keeping the voltage across the battery clamped to one diode junction below zero. FIG. 11A shows the normal charge current flow when a charger 69a is connected to the battery. FIG. 11B shows the current flow when the internal switch opens, when no capacitor is present. FIG. 11C shows current flow when the switch opens with a capacitor present. FIG. 11D shows the normal discharge current flow when a load 69b is connected to battery 12 in a series loop with an inductor 69d. FIG. 11E shows discharge current flow without a diode present. FIG. 11F shows discharge flow with a diode present.

In summary the integrated battery terminal energy clamp includes a switch and a capacitor arranged in a series circuit with the battery cells, where the capacitor acts as an energy reservoir for all currents that would otherwise flow into the positive terminal when the switch opens. A high current diode is coupled in parallel to the capacitor and disposed across the output terminals of the battery which allows current to continue to flow while keeping the voltage across the battery clamped. The energy clamp is disposed within the battery housing.

The battery also includes thermal measurement and controls, specifically for identifying valid temperature data when providing battery safety functions.

Battery packs need to provide thermal protection functions to protect them from excessive heating, or use in extreme cold in order to assure safety in their immediate environment. Batteries can be known to overheat during charge and discharge cycles which have the possibility of combustion. This function is usually accomplished using low cost thermistors along with associated control circuitry. Current state of the art would have that control circuit encapsulated in a low cost microprocessor. Simultaneously, that circuitry/function block requires a degree of immunity from radiated electro-magnetic fields. Thermistors, placed inside a battery pack for thermal measurement become antennas to those fields, and in many cases make it extremely difficult to determine the validity of the monitored temperature. This invention provides a method of data discrimination as a means to ascertain the validity of the measured data.

In the prior art solutions, if the rate of change of temperature is low, existing methods would be to provide extensive frequency selective filtering at each temperature sensor input. This solution is comprised of resistor-capacitor-inductor filter networks, active filter networks, etc.

According to the invention, thermistors are sampled at a fixed rate by a microprocessor. Thermal samples are then digitally filtered and analyzed for the following:

Is the current filtered sample within the valid temperature range?

Is the difference between the current sample and the last sample within a defined range?

If more than one sensor is used, is the difference between the current sample and a running average for the battery pack within a defined range?

Figure 12:
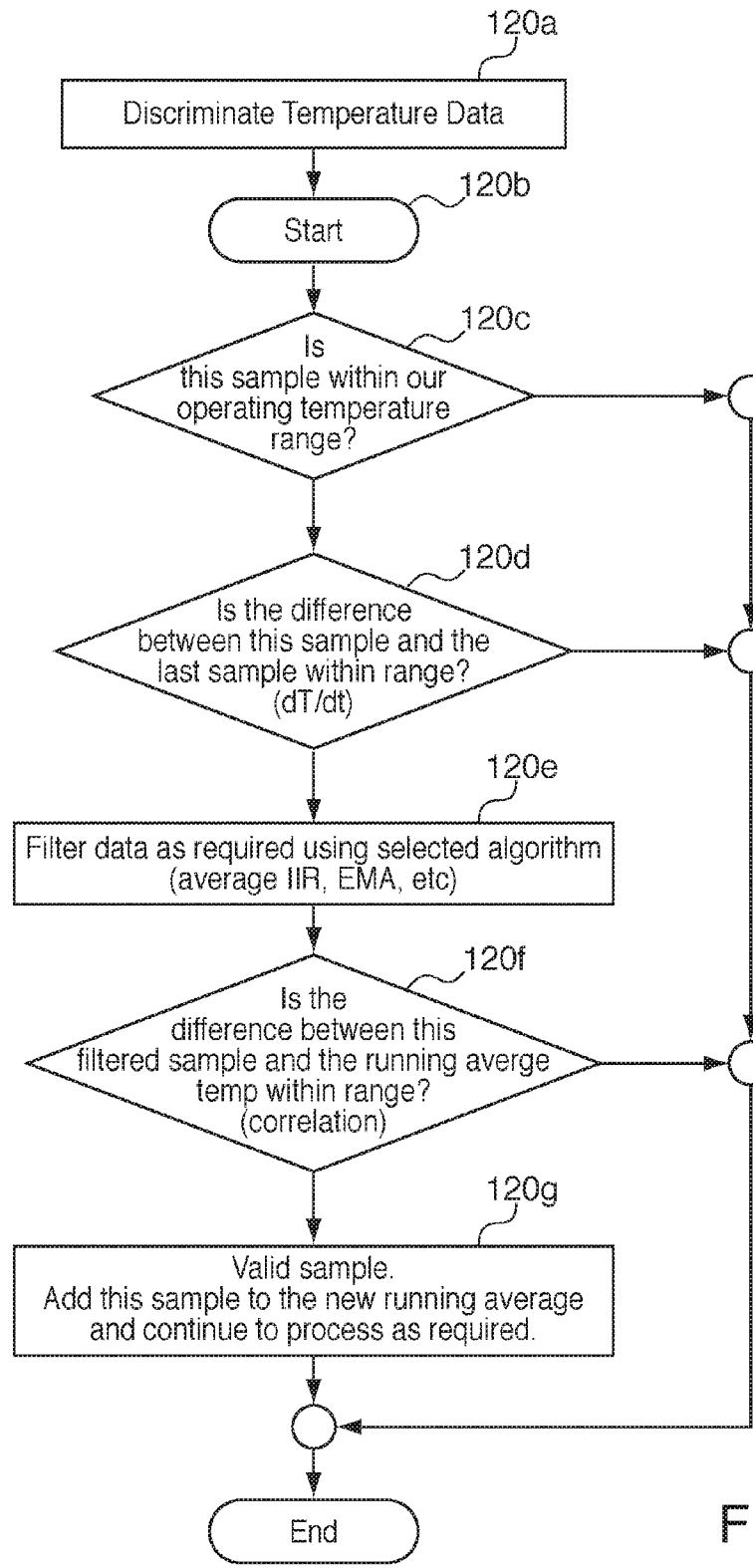
FIG. 12 is a flowchart showing various steps used in the temperature discrimination process.

If all of these questions are true, the sample is considered valid and may be used for safety purposes. This solution has the benefit that it is able to discriminate against transient anomalous data when subjected to strong electro-magnetic fields, while still offering the excellent transient response that is required of large format batteries where combustion could have catastrophic. In addition, as a large number of batteries are now "intelligent" and contain microprocessors, this solution in many cases will be more cost effective to produce, and are more easily tailored to fit a given application. The process flowchart is shown in FIG. 12. The steps include Discriminate Temperature Data 120a and proceed to Start 120b. The diamond shapes represent decision blocks, where the flow chart can proceed to either a YES path continuing down, or a NO path diverting to the right.

Diamond 1 queries Whether the sample is within an operating temperature range 120c. Diamond 2 queries Whether the difference between the current sample and the previous sample are in range (dT/dt)m 120d. The next step is to Filter the Data using selected algorithms, for example, average, IIR, EMA or others 120e. Diamond 3 queries whether the Difference between the filtered sample and the running average temperature are within range 120f. The next step confirms a Valid Sample, which is Added to the new running average 120g, to continue or repeat the process as required.

This algorithm was applied to the Bren-Tronics 6T Li-Ion battery and was successful in meeting the requirements of RF susceptibility where conventional analog solutions were not. In summary, the thermal protection system for a battery includes a thermistor positioned to sense battery temperature and a microprocessor coupled to said thermistor for sampling temperature data, digitally filtering said samples to generate several parameters, and collectively analyzing said parameters to determine the sample validity. A first parameter (Diamond 1) determines if the sample is within a valid temperature range. A second parameter (Diamond 2) determines if the difference between the last two samples are within a predefined range. The thermal protection system includes two or more thermistors. A third parameter (Diamond 3) compares individual thermistor samples to the running average of all thermistor samples.

What is claimed is:

1. An apparatus for electronically controlling and mechanically coupling cells together within a battery housing comprising:
   a plurality of cells having a cylindrical shape and a diameter;
   two end frames each having a plurality of cell-receiving cups arranged in rows, wherein adjacent rows are staggered from each other by one-half of the cell diameter so that said cells are retained within the end frames in a honeycomb configuration to form a cell pack, wherein said cell-receiving cups have an annular ring capped on one end with a circular bottom having an aperture therethrough;
   connecting tabs extending across adjacent cups and electrically soldered to said cells through said apertures to sandwich the end frames between said cells and said connecting tabs; and
   a control circuit including an LC steered resonant flyback converter with a zero voltage MOSFET switch for switching of sinusoidal waveforms at the self-resonant frequency of the LC steered resonant flyback converter to maintain all of said cells at the same potential voltage and state of charge.

2. The apparatus of claim 1, wherein said cells, said zero voltage MOSFET switch and the first inductor (L) are in a series loop and a first diode and the first capacitor (C) in parallel with said zero voltage MOSFET switch.

3. The apparatus of claim 2, further including a transformer having said first inductor (L) as the primary winding and including a secondary winding in series with a second diode and a second output capacitor, wherein the transformer output is in parallel with said second output capacitor.

4. The apparatus of claim 1, wherein said end frame includes an internal side facing said cells and including said cell-receiving cups, and an opposed external side with channels for receiving said connecting tabs.

5. The apparatus of claim 4, wherein said internal side of said end frame includes support posts extending off of said annular rings with tapered ends that align said cell within said cell-receiving cup.

6. The apparatus of claim 5, wherein said support posts are disposed between selected groups of three adjacent cell-receiving cups.

7. The apparatus of claim 6, wherein selected ones of said support posts have a triangular cross-sectional shape with the three sides being concave with a curvature matching the cylindrical shape of said cells.

8. The apparatus of claim 1, further including thermal fuses electrically connected to said cells which blow under excessive currents, and potting compound surrounding said thermal fuses and part of the connection to the cells to insulate the thermal fuses from heat generated from normal cell operation.

9. The apparatus of claim 1, wherein said cells are Lithium-Ion (Li-Ion) cells.

10. The apparatus of claim 1, further including a strip heater intertwined between said cells in the separation formed by said honeycomb configuration.

11. The apparatus of claim 1, further including a smart bus and a multi-pin connector mounted to said battery housing and coupled to said control circuit including a low voltage pin to supply low voltage and activate smart bus function, a high voltage pin to supply high voltage and activate the smart bus function; a high communication signal pin, a low communication signal pin and a ground pin; wherein the smart bus provides state of charge, voltage, current and other battery information.

12. The apparatus of claim 11, further including a visual display mounted to said battery housing and coupled to said smart bus to indicate the battery state of charge.

13. The apparatus of claim 1, wherein said control circuit includes a thermal protection system comprising:
   a thermistor to sense battery temperature and output temperature data; and
   a microprocessor coupled to said thermistor for sampling the temperature data, digitally filtering said samples to generate parameters, and collectively analyzing said parameters to determine the sample validity.

14. An apparatus for electronically controlling and mechanically coupling cells together within a battery housing comprising:
- a plurality of cells having a cylindrical shape and a diameter;
- two end frames each having a plurality of cell-receiving cups arranged in rows, wherein adjacent rows are staggered from each other by one-half of the cell diameter so that said cells are retained within the end frames in a honeycomb configuration to form a cell pack, wherein said cell-receiving cups have an annular ring capped on one end with a circular bottom having an aperture therethrough;
- connecting tabs extending across adjacent cups and electrically soldered to said cells through said apertures to sandwich the end frames between said cells and said connecting tabs; and
- a control circuit including an isolated steered current resonant converter to provide a high side power supply for a MOSFET switch where energy will be transferred back and forth between an inductor (L) and a first capacitor (C); wherein said cells, said MOSFET switch and said inductor (L) are in a series loop and a first diode and said first capacitor (C) are in parallel with said MOSFET switch.

15. The apparatus of claim 14, further including a transformer having said inductor (L) as the primary winding and including a second winding in series with a second diode and a second output capacitor, wherein the transformer output is in parallel with said second capacitor.

16. An apparatus for electronically controlling and mechanically coupling cells together within a battery housing comprising:
- a plurality of cells having a cylindrical shape and a diameter;
- two end frames each having a plurality of cell-receiving cups arranged in rows, wherein adjacent rows are staggered from each other by one-half of the cell diameter so that said cells are retained within the end frames in a honeycomb configuration to form a cell pack, wherein said cell-receiving cups have an annular ring capped on one end with a circular bottom having an aperture therethrough;
- connecting tabs extending across adjacent cups and electrically soldered to said cells through said apertures to sandwich the end frames between said cells and said connecting tabs;
- an electronic switch and a control circuit including and LC resonant converter to maintain all of said cells at the same potential and state of charge; and
- isolation mounts and a five-sided pocket, wherein said end frame includes slots along its periphery which have a height equal to the height of said annular rings, wherein said isolation mounts are installed in said slots to absorb shock and vibration by distancing the cell pack from the internal surfaces of the five-sided pocket when the cell pack is disposed therein to form a pocketed cell pack.

17. The apparatus of claim 16, wherein the battery housing further includes:
- a tray cover attached to said battery housing and forming the sixth side of said five-sided pockets, wherein said isolation mounts distance the cell pack from the bottom surface of said tray cover.

18. The apparatus of claim 17, further including a negative bus bar disposed within the tray, a positive bus bar disposed within the tray, and said electronic switch and control circuit disposed within the tray.

19. The apparatus of claim 18, wherein each cell pack includes one set of connecting tabs that electrically terminate in a negative cell pack terminal and another set of connecting tabs that electrically terminate in a positive cell pack terminal, wherein said pocketed cell packs are arranged within said battery housing so that said negative cell pack terminals are located in the middle of said battery housing and said positive cell pack terminals are at the edge of said battery housing, wherein said negative bus bar is located in the middle of said tray cover directly above, and in electrical connection with, the negative cell pack terminals.

20. The apparatus of claim 18, wherein said positive bus bar is a continuous rectangular metal frame disposed around the edge of said tray cover directly above, and in electrical connection with, the said positive cell pack terminals.

21. The apparatus of claim 20, wherein said continuous rectangular metal frame structurally supports said tray cover around its periphery where it is bonded to said battery housing.

22. The apparatus of claim 21, further including a positive battery output terminal, wherein said electronic switch comprises a high density bidirectional MOSFET switch having a plurality of bilateral paths in parallel with cell balancing resistors so that all paths transmit the same current, wherein said high density bidirectional MOSFET switch electrically couples said cells to said positive bus bar, wherein said positive bus bar is a heat sink for said MOSFET switch.

23. The apparatus of claim 21, further including a negative battery output terminal electrically coupled to said negative bus bar, and positive and negative battery posts which are keyed for connection to said positive and negative battery output terminals, respectively, where said positive battery post includes keying which is different from said battery post keying.

24. An apparatus for electronically controlling and mechanically coupling cells together within a battery housing comprising
- a plurality of cells having a cylindrical shape and a diameter; two end frames each having a plurality of cell-receiving cups arranged in rows, wherein adjacent rows are staggered from each other by one-half of the cell diameter so that said cells are retained within the end frames in a honeycomb configuration to form a cell pack, wherein said cell-receiving cups have an annular ring capped on one end with a circular bottom having an aperture therethrough,
- connecting tabs extending across adjacent cups and electrically soldered to said cells through said apertures to sandwich the end frames between said cells and said connecting tabs; and
- an electronic switch and a control circuit including: an LC resonant converter to maintain all of said cells at the same potential voltage and state of charge; and a clamp having a second switch and a capacitor arranged in series with said cells, wherein said capacitor comprises an energy reservoir to absorb currents when said second switch is open; said clamp further includes a diode in parallel with said capacitor and coupled across the positive and negative terminals of said cell so that current continues to flow while the voltage across the battery is clamped.

* * * * *